(12) United States Patent
Greene et al.

(10) Patent No.: US 11,757,012 B2
(45) Date of Patent: Sep. 12, 2023

(54) SOURCE AND DRAIN CONTACT CUT LAST PROCESS TO ENABLE WRAP-AROUND-CONTACT

(71) Applicant: International Business Machines Corporation, Armonk, NY (US)

(72) Inventors: Andrew Greene, Slingerlands, NY (US); Dechao Guo, Niskayuna, NY (US); Tenko Yamashita, Schenectady, NY (US); Veeraraghavan S. Basker, Schenectady, NY (US); Robert Robison, Rexford, NY (US); Ardasheir Rahman, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 16/687,736

(22) Filed: Nov. 19, 2019

(65) Prior Publication Data

US 2020/0152751 A1 May 14, 2020

Related U.S. Application Data

(62) Division of application No. 16/188,612, filed on Nov. 13, 2018, now Pat. No. 10,840,345.

(51) Int. Cl.
*H01L 29/417* (2006.01)
*H01L 29/40* (2006.01)
(Continued)

(52) U.S. Cl.
CPC .. *H01L 29/41791* (2013.01); *H01L 21/28518* (2013.01); *H01L 21/76897* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 8,362,574 B2 1/2013 Kawasaki et al.
9,318,581 B1 4/2016 Guo et al.
(Continued)

OTHER PUBLICATIONS

Andrew Greene et al., "Source and Drain Contact Cut Last Process to Enable Wrap-Around-Contact," U.S. Appl. No. 16/188,612, filed Nov. 13, 2018.
(Continued)

*Primary Examiner* — Kevin Parendo
(74) *Attorney, Agent, or Firm* — CANTOR COLBURN LLP; Samuel Waldbaum (57) ABSTRACT

A technique relates to a semiconductor device. A source or drain (S/D) contact liner is formed on one or more S/D regions. Annealing is performed to form a silicide layer around the one or more S/D regions, the silicide layer being formed at an interface between the S/D contact liner and the S/D regions. A block layer is formed into a pattern over the one or more S/D regions, such that a portion of the S/D contact liner is protected by the block layer. Unprotected portions of the S/D contact liner are removed, such that the S/D contact liner protected by the block layer remains over the one or more S/D regions. The block layer and S/D contacts are formed on the S/D contact liner over the one or more S/D regions.

20 Claims, 11 Drawing Sheets

(51) Int. Cl.
*H01L 21/285* (2006.01)
*H01L 21/8234* (2006.01)
*H01L 29/45* (2006.01)
*H01L 21/768* (2006.01)
*H01L 27/088* (2006.01)
*H01L 29/78* (2006.01)

(52) U.S. Cl.
CPC ............. *H01L 21/823418* (2013.01); *H01L 21/823431* (2013.01); *H01L 21/823475* (2013.01); *H01L 27/088* (2013.01); *H01L 27/0886* (2013.01); *H01L 29/401* (2013.01); *H01L 29/456* (2013.01); *H01L 29/7851* (2013.01); *H01L 2029/7858* (2013.01)

(58) Field of Classification Search
CPC ......... H01L 27/10826; H01L 27/10879; H01L 27/1211; H01L 29/66795–66818; H01L 29/785–7856; H01L 2029/7857–7858; H01L 29/41791
See application file for complete search history.

(56) References Cited

U.S. PATENT DOCUMENTS

| | | | |
|---|---|---|---|
| 9,496,225 B1 | 11/2016 | Adusumilli et al. | |
| 9,865,595 B1 | 1/2018 | Yu et al. | |
| 9,923,078 B2 | 3/2018 | Greene et al. | |
| 10,141,431 B1 | 11/2018 | Hung et al. | |
| 10,431,503 B2* | 10/2019 | Adusumilli | H01L 21/823814 |
| 10,453,935 B2* | 10/2019 | Adusumilli | H01L 21/28518 |
| 10,546,941 B2* | 1/2020 | Adusumilli | H01L 29/66795 |
| 10,937,889 B2* | 3/2021 | Adusumilli | H01L 29/41791 |
| 10,943,988 B2* | 3/2021 | Adusumilli | H01L 21/823431 |
| 2011/0303972 A1* | 12/2011 | Saitoh | H01L 27/11582 257/329 |
| 2015/0041918 A1 | 2/2015 | Wann et al. | |
| 2015/0380251 A1 | 12/2015 | Glodde et al. | |
| 2016/0322304 A1* | 11/2016 | Kim | H01L 29/66795 |
| 2016/0343825 A1* | 11/2016 | Bae | H01L 21/823437 |
| 2017/0125543 A1 | 5/2017 | Greene et al. | |
| 2017/0194212 A1 | 7/2017 | Hung et al. | |
| 2017/0207095 A1 | 7/2017 | Lee et al. | |
| 2017/0323794 A1 | 11/2017 | Anderson et al. | |
| 2017/0352762 A1* | 12/2017 | Yang | H01L 29/0847 |
| 2018/0033630 A1 | 2/2018 | Huang et al. | |
| 2018/0040738 A1 | 2/2018 | Ching et al. | |
| 2018/0082909 A1* | 3/2018 | Adusumilli | H01L 21/823814 |
| 2018/0090582 A1 | 3/2018 | Adusumilli et al. | |
| 2018/0151683 A1* | 5/2018 | Yeo | H01L 29/0847 |
| 2018/0269305 A1 | 9/2018 | Bao et al. | |
| 2018/0308951 A1* | 10/2018 | Adusumilli | H01L 29/66545 |
| 2018/0308952 A1* | 10/2018 | Adusumilli | H01L 21/28518 |
| 2019/0131171 A1* | 5/2019 | Gwak | H01L 23/528 |
| 2019/0157406 A1* | 5/2019 | Hwang | H01L 29/0653 |
| 2019/0348519 A1* | 11/2019 | Adusumilli | H01L 29/66795 |
| 2020/0058758 A1* | 2/2020 | Adusumilli | H01L 23/485 |

OTHER PUBLICATIONS

Anonymous, "Making Early SD contact for FinFET," IPCOM000250530D, Jul. 2017, 4 pages.
Anonymous, "Segmented Stacked FinFET for Improved Contact Resistance," IPCOM000242086D, Jun. 2015, 2 pages.
Anonymous, "Making Low Resistive Contact by Using Early Dummy Contact Scheme," IPCOM000250531D, Jul. 2017, 3 pages.
List of IBM Patents or Patent Applications Treaed as Related; (Appendix P); Date Filed: Nov. 19, 2019, 2 pages.

* cited by examiner

SOURCE AND DRAIN CONTACT CUT LAST PROCESS TO ENABLE WRAP-AROUND-CONTACT

DOMESTIC PRIORITY

This application is a divisional of U.S. patent application Ser. No. 16/188,612, filed Nov. 13, 2018, the disclosure of which is incorporated by reference herein in its entirety.

BACKGROUND

The present invention generally relates to fabrication methods and resulting structures for semiconductor devices, and more specifically, to a source and drain contact cut last process to enable wrap-around-contact.

A metal-oxide-semiconductor field-effect transistor (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by the oxide portion of the metal oxide gate electrode. The oxide portion of the gate electrode can be implemented as a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers. Complementary metal oxide semiconductor (CMOS) is a technology that uses complementary and symmetrical pairs of p-type and n-type MOSFETs to implement logic functions.

SUMMARY

Embodiments of the invention are directed to a method for forming a semiconductor device. A non-limiting example of the method includes forming a source or drain (S/D) contact liner on one or more S/D regions and annealing to form a silicide layer around the one or more S/D regions, the silicide layer being formed at an interface between the S/D contact liner and the S/D regions. The method includes forming a block layer into a pattern over the one or more S/D regions, such that a portion of the S/D contact liner is protected by the block layer, and removing unprotected portions of the S/D contact liner, such that the S/D contact liner protected by the block layer remains over the one or more S/D regions. Also, the method includes removing the block layer and forming S/D contacts on the S/D contact liner over the one or more S/D regions.

Embodiments of the invention are directed to a semiconductor device. A non-limiting example of the semiconductor device includes a source or drain (S/D) contact liner on one or more S/D regions, where an upper portion of the one or more S/D regions comprises the S/D contact liner while a lower portion of the one or more S/D regions is free of the S/D contact liner. The semiconductor device includes a silicide layer formed around the upper portion and the lower portion of the one or more S/D regions, where the silicide layer is formed between the S/D contact liner and the one or more S/D regions, and S/D contacts formed on the S/D contact liner over the one or more S/D regions.

Embodiments of the invention are directed to a source/drain cut last method of forming a semiconductor device. A non-limiting example of the method includes forming a source or drain (S/D) contact liner on one or more S/D regions and annealing to form a silicide layer around the one or more S/D regions, the silicide layer being formed at an interface between the S/D contact liner and the S/D regions. The method includes forming a block layer over the one or more S/D regions, cutting a pattern of trenches in the block layer such that a portion of the S/D contact liner is protected by the block layer, and removing unprotected portions of the S/D contact liner, such that the S/D contact liner protected by the block layer remains over the one or more S/D regions. Also, the method includes depositing a fill material in the trenches, removing the block layer to leave S/D contact openings in the fill material, and forming S/D contacts on the S/D contact liner over the one or more S/D regions, such that the S/D contacts are formed in the S/D contact openings.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, source and drain (S/D) conductive contacts are formed on exposed surfaces of the S/D regions. The S/D regions are typically deposited epitaxially. The anisotropic S/D contact etch and the contact etch stop layer (CESL) etch damages the exposed S/D surfaces, which in turn degrades the contact resistance $R_{on}$. Additionally, this etch can damage and erode the self-aligned contact (SAC) cap used to protect the gate and creates step height issues between the gate contact and the source/drain contact. As device size scales (i.e., reduces) for transistors, the state-of-the-art process has a restricted or limited contact area between the S/D contact and the exposed S/D surfaces, thereby limiting the contact resistance $R_{on}$.

Turning now to an overview of the aspects of the invention, one or more embodiments of the invention provide semiconductor devices and a method of forming the semiconductor devices. Embodiments of the invention provide methods and structures by using a source/drain contact cut process to enable wrap-around-contact. This is a source/drain contact "cut last" process with no (or at least minimal) epitaxial damage to improve contact resistance $R_{on}$. The source/drain contact "cut last" process performs a selective inter-level dielectric (ILD) and contact etch stop layer (CESL) etch without epitaxy damage, and then performs a Ti/TiN liner deposition for silicide formation after an ILD reactive ion etch (ME) on all exposed epitaxy surfaces. The silicide formation, which is a "silicide-all-around" formation, is after anneal but prior to source/drain contact cut patterning. The liner (unreacted Ti/TiN) cut process allows for the source/drain contact cut on the epitaxy while maintaining wrap-around-contact (WAC) silicide contact, such that the source/drain contact cut does not extend past the epitaxy. This is beneficial for scaling and minimizing shorts between the source/drain contact and gate contact.

Figure 1A:
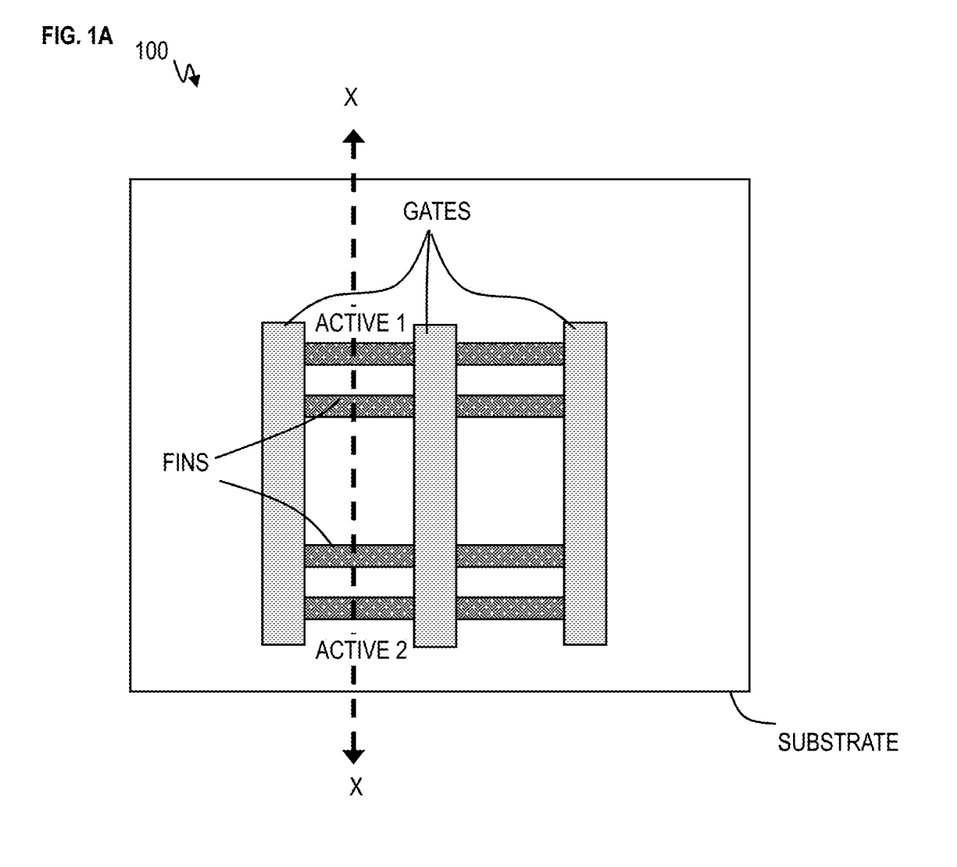
FIG. 1A depicts a simple diagram of a top view of a semiconductor device according to embodiments of the invention.
Figure 1B:
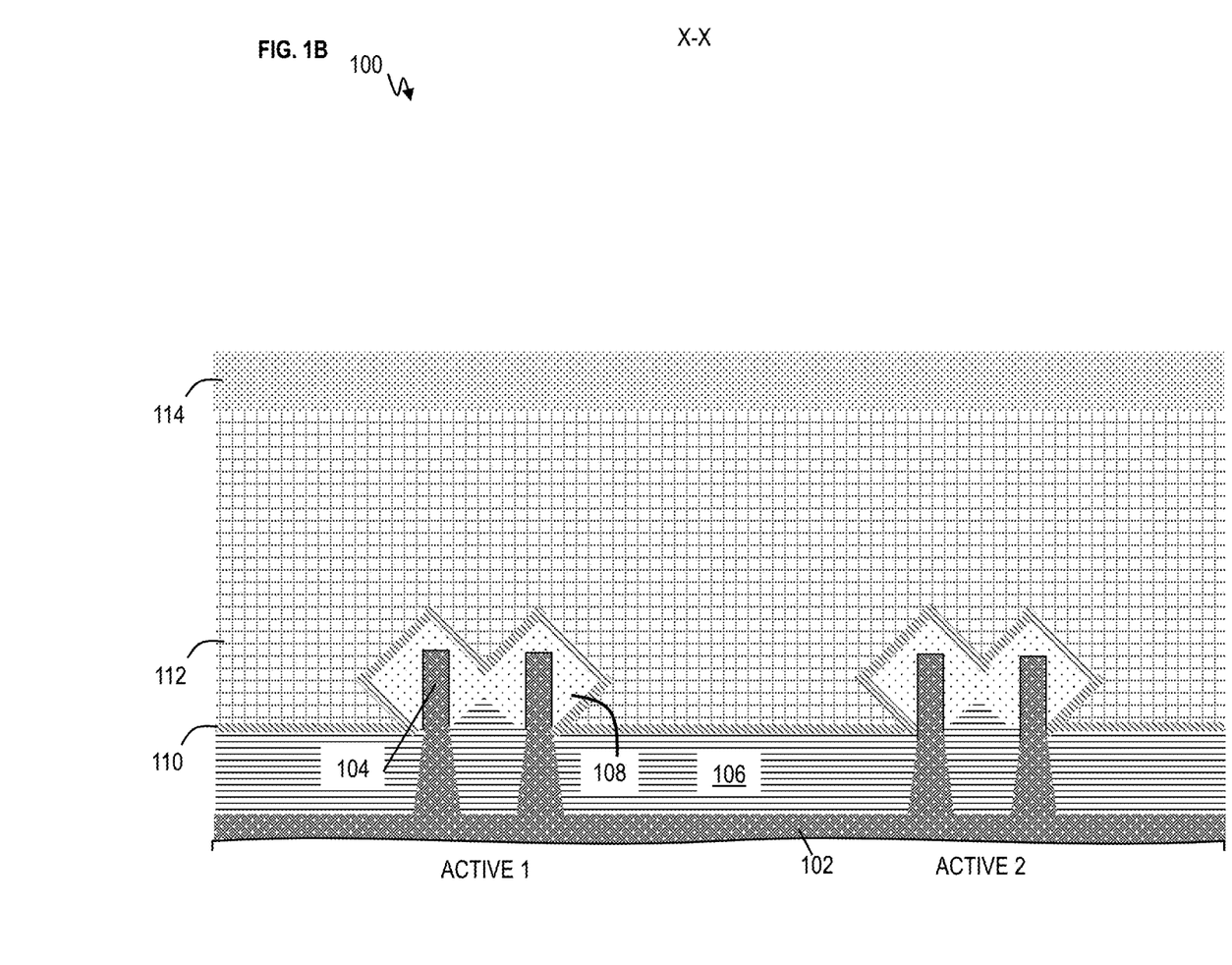
FIG. 1B depicts a cross-sectional view of the semiconductor device taken along line X-X in FIG. 1A after an initial set of fabrication operations according to embodiments of the invention.

Turning now to a more detailed description of aspects of the present invention, FIG. 1A depicts a simple diagram of a top view of a semiconductor device 100 according to embodiments of the invention. For simplicity and ease of understanding, FIG. 1A omits some layers (elements) so as not to obscure the figure. FIG. 1B depicts a cross-sectional view of the semiconductor device 100 shown in FIG. 1A taken along line X-X according to embodiments of the invention. Semiconductor devices are formed using active regions of a wafer, such as active 1 and active 2. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

After initial fabrication processing, the semiconductor device 100 includes fins 104. Although fins are shown, it should be understood that embodiments of the invention can include architecture options other than fins, such as gate-all-around nanosheets. The fins 104 can be formed on the substrate 102. Also, the substrate 102 can be etched to form fins 104. The fins 104 and substrate 102 are a semiconductor material. The semiconductor material can be a silicon, although other materials can be used as the fins 104 and/or substrate 102.

A shallow trench isolation (STI) region 106 can be formed on the substrate 102 and a bottom/lower portion of the fins 104 to separate the active regions. Source and drain epitaxial regions 108 are formed on the upper portion of the fins 104. The source/drain regions 108 can be epitaxially grown from the fins 104 and are semiconductor material. The source/drain epitaxial regions 108 can be doped with n-type or p-type dopants for n-type FETs or p-type FETs, respectively.

A contact etch stop layer (CESL) 110 (or liner layer) is formed on top of the STI region 106 and the source and drain epitaxial regions 108. The CESL 110 is a non-conductive material. The CESL 110 can be a nitride based material such as silicon nitride (SiN).

Inter-level dielectric (ILD) material 112 is formed on top of the CESL 110. The ILD material 112 is a low-k dielectric material. The low-k dielectric material can be, for example, an oxide based material such as silicon dioxide with k about 3.8. A layer 114 is formed on top of the ILD 112. The layer 114 is a low-k dielectric material, such as, for example, an oxide based material (e.g., silicon dioxide).

Figure 2:
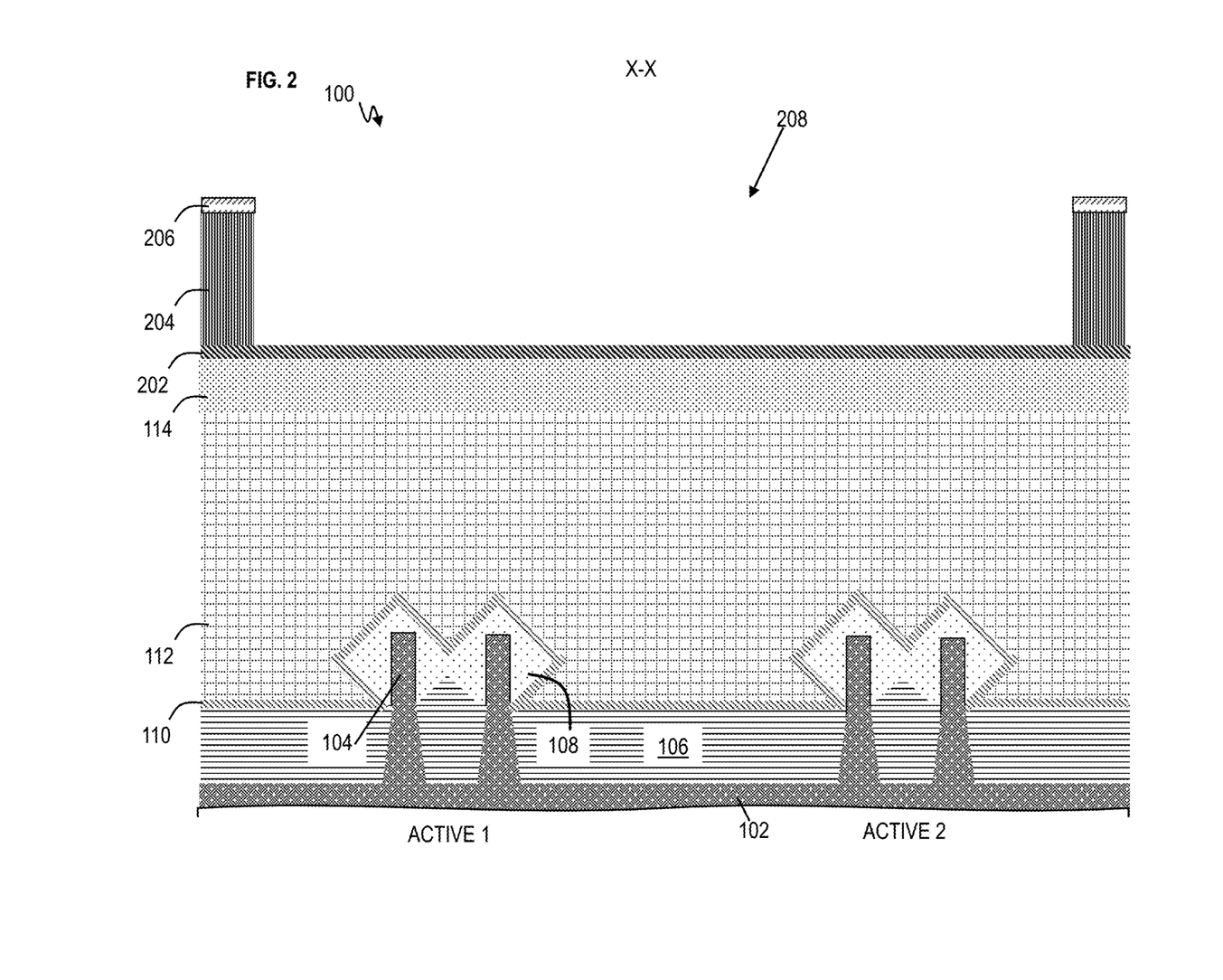
FIG. 2 depicts a cross-sectional view of the semiconductor device taken along line X-X in FIG. 1A after an initial set of fabrication operations according to embodiments of the invention.

FIG. 2 depicts a cross-sectional view of the semiconductor device 100 shown in FIG. 1A taken along line X-X according to embodiments of the invention. A liner 202 is formed on the layer 114. The liner 202 can be a nitride based material such as silicon nitride. A planarization layer 204 is deposited on top of the liner 202, and an antireflective coating (ARC) layer 206 is deposited on top of the planarization layer 204. The planarization layer 204 can be an organic planarization layer (OPL), an organic dielectric layer (ODL), etc. The ARC layer 206 can be organic or inorganic material depending on the desired method of removal. The ARC layer 206 can be a low temperature oxide (LTO). The ARC layer 206 can also include silicon ARC (SiARC) based materials and titanium ARC (TiARC) based materials. A resist layer (not shown) is deposited on top of the ARC layer 206, and lithography is performed to pattern an opening in the resist layer. The pattern is etched into the ARC layer 206 and the planarization layer 204, thereby forming opening 208. The etch can be reactive ion etching (RIE). This process is referred to as active area patterning.

Figure 3:
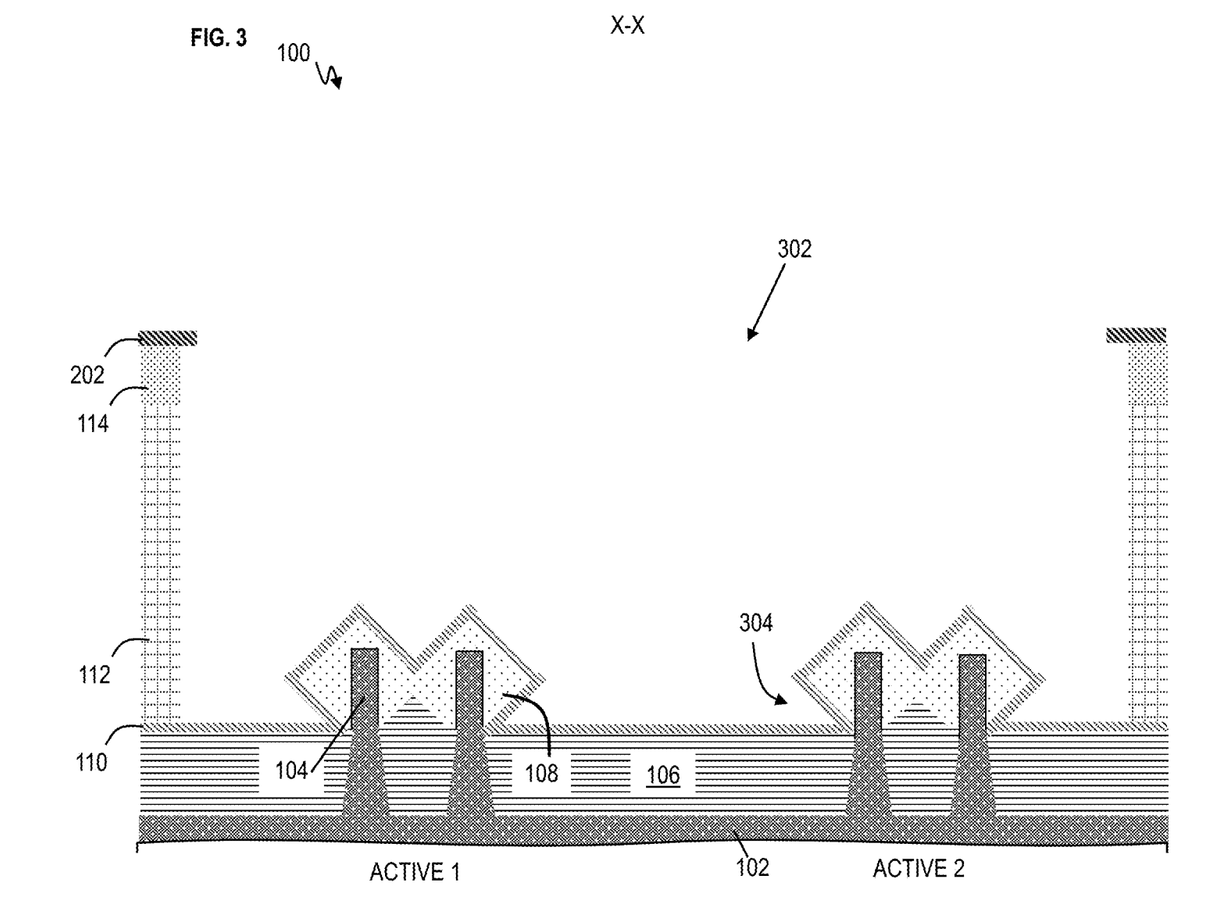
FIG. 3 depicts a cross-sectional view of the semiconductor device taken along line X-X in FIG. 1A after fabrication operations according to embodiments of the invention.

FIG. 3 depicts a cross-sectional view of the semiconductor device 100 shown in FIG. 1A taken along line X-X according to embodiments of the invention. Further etching is performed which etches through the liner 202, layer 114, and ILD layer 112 selectively stopping on the CESL layer 110, thereby forming opening 302. The etch can be a ME etch. For example, the process can be (1) etch top SiN patterning layer 202, switch chemistry to (2) etch $SiO_2$/ILD layers, and (3) stop on CESL layer 110. Since it is a sequence, the ME chemistry used to etch the first layer is not used when etching the $SiO_2$. The planarization layer 204 is removed which also removes ARC layer 206. The planarization layer 204 can be removed by, for example, using an OPL or ODL ash.

The opening 302 exposes the CESL layer 110 covering the source and drain epitaxial regions 108. There can sometimes be a portion of ILD layer 112 remaining on the underbelly 304 of the source and drain epitaxial regions 108, after the etch forming the opening 302 through the liner 202, layer 114, and ILD layer 112. An isotropic etch can be performed to remove any ILD material 112 (e.g., silicon dioxide) from the underbelly 304 of the source and drain epitaxial regions 108, while the CESL layer 110 protects the source and drain epitaxial regions 108. The isotropic etch is a wet or dry etch that is selective to silicon nitride (i.e., does not etch the CESL layer 110). The etchant can be buffered oxide etch (BOE), also known as buffered hydrofluoric acid (BHF) or a reactive chemical oxide removal etch process.

Figure 4:
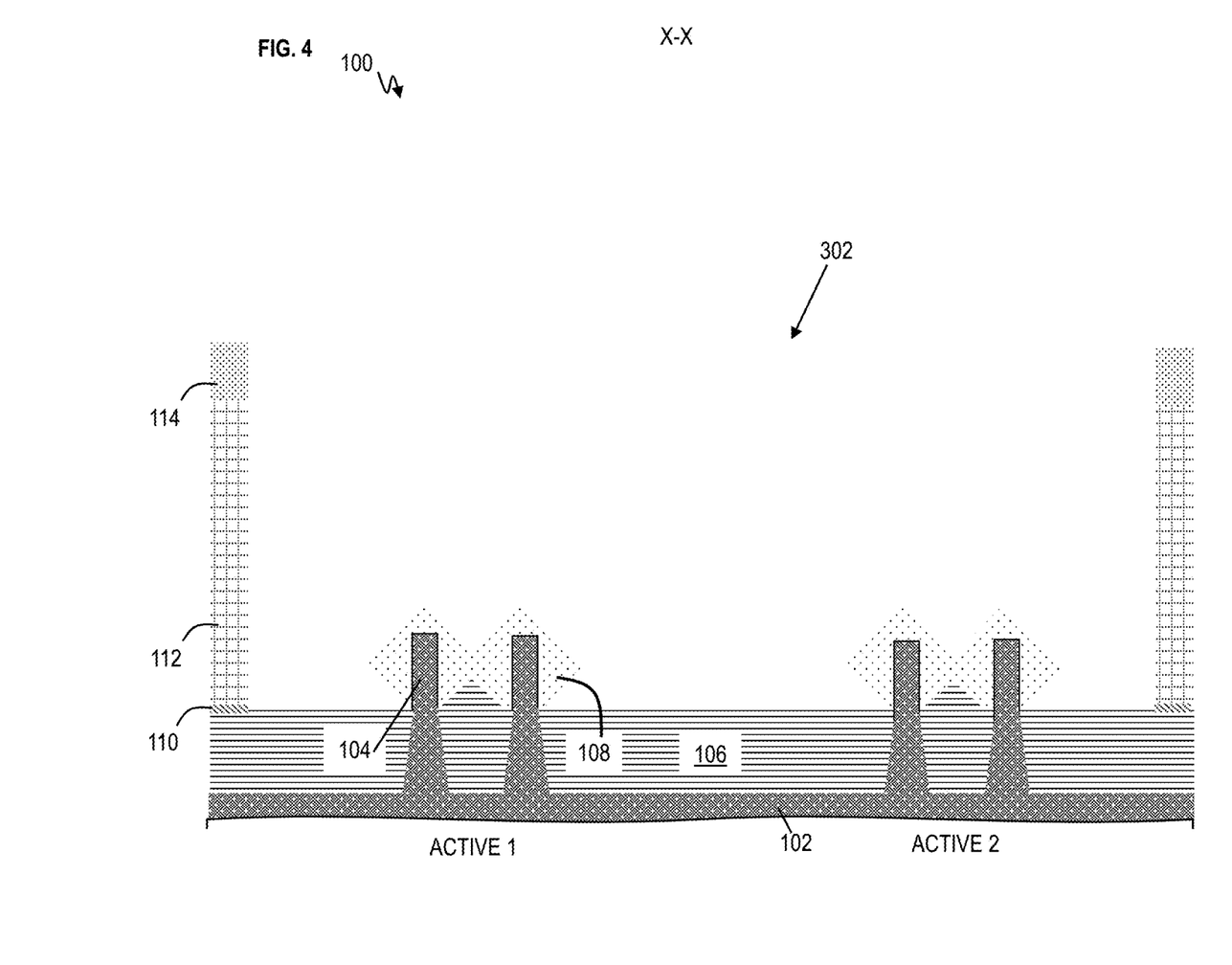
FIG. 4 depicts a cross-sectional view of the semiconductor device taken along line X-X in FIG. 1A after fabrication operations according to embodiments of the invention.

FIG. 4 depicts a cross-sectional view of the semiconductor device 100 shown in FIG. 1A taken along line X-X according to embodiments of the invention. Etching is performed to remove the CESL layer 110 (e.g., SiN) selective over the source and drain epitaxial regions 108, the STI region 106 (e.g., $SiO_2$), and gate spacers (e.g., SiBCN, SiOCN, etc.) which can generally be identified as the gate shown in FIG. 1A. An example etchant to remove the CESL layer 110 without etching the other layers can be a reactive chemical etch SiN removal but selective to the spacer and oxide. Etching the CESL layer 110 strips the SiN, thereby exposing the source and drain epitaxial regions 108 for subsequent Ti/TiN liner deposition.

Figure 5:
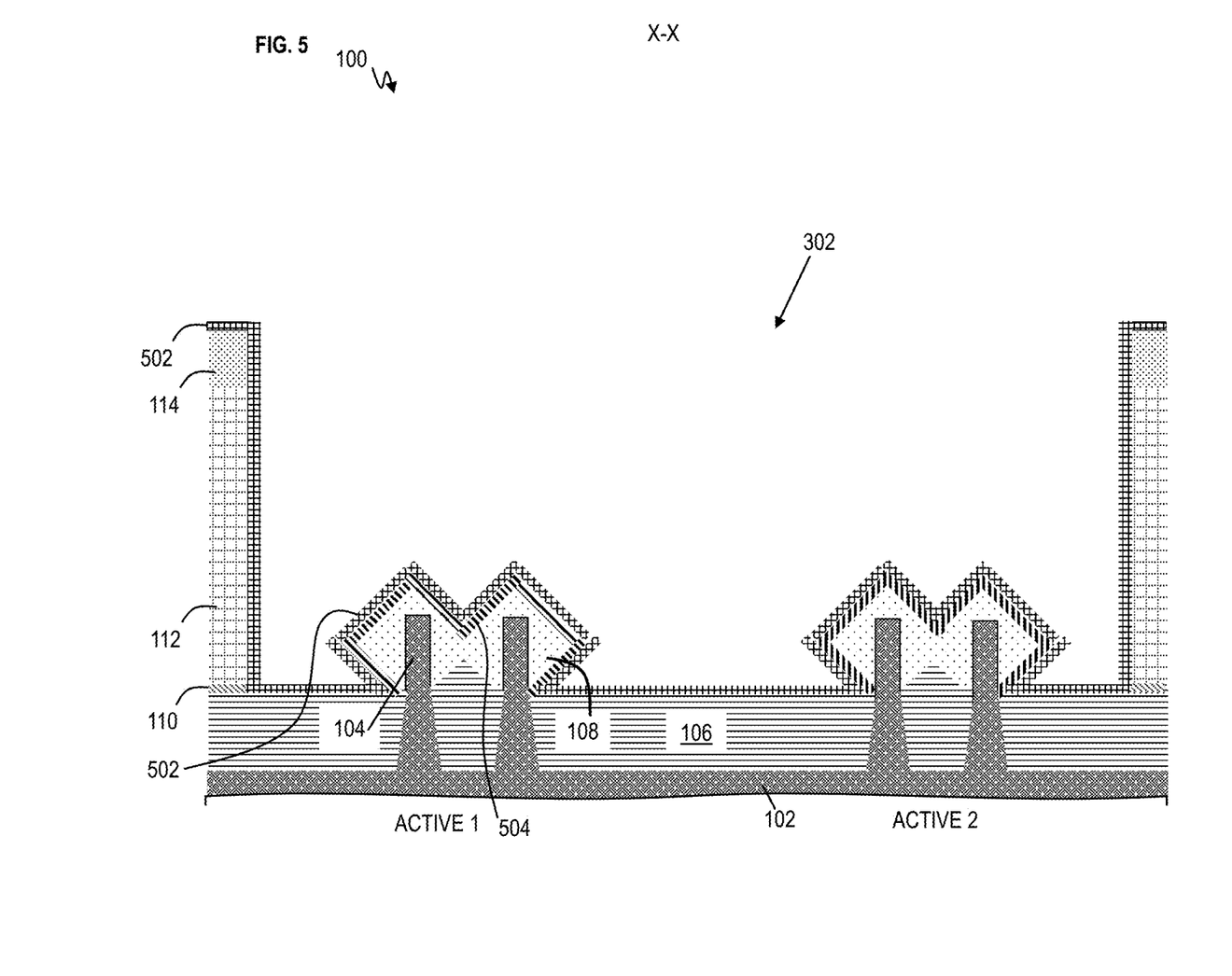
FIG. 5 depicts a cross-sectional view of the semiconductor device taken along line X-X in FIG. 1A after fabrication operations according to embodiments of the invention.

FIG. 5 depicts a cross-sectional view of the semiconductor device 100 shown in FIG. 1A taken along line X-X according to embodiments of the invention. Silicide formation is performed. A contact liner 502 is conformally deposited over exposed surfaces. The contact liner 502 can be a Ti/TiN stack in which the titanium (Ti) is deposited first and titanium nitride (TiN) second.

Figure 7:
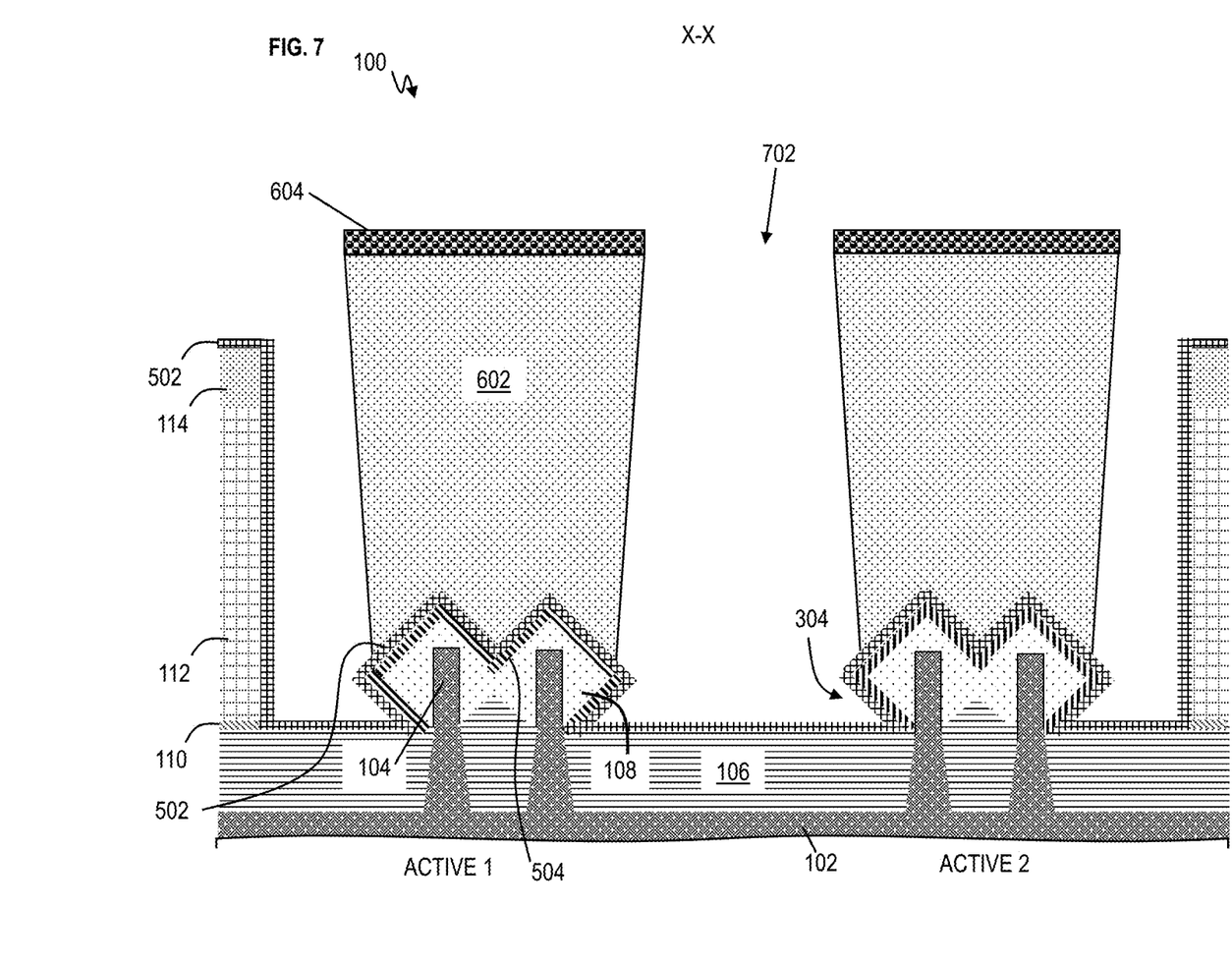
FIG. 7 depicts a cross-sectional view of the semiconductor device taken along line X-X in FIG. 1A after fabrication operations according to embodiments of the invention.

Annealing is performed to form silicide 504 around all exposed epitaxial surfaces of the source and drain epitaxial regions 108 prior to the source/drain contact patterning/cut in FIG. 7. The silicide 504 is formed as a reaction between the titanium layer and the material of source and drain epitaxial regions 108.

Figure 6:
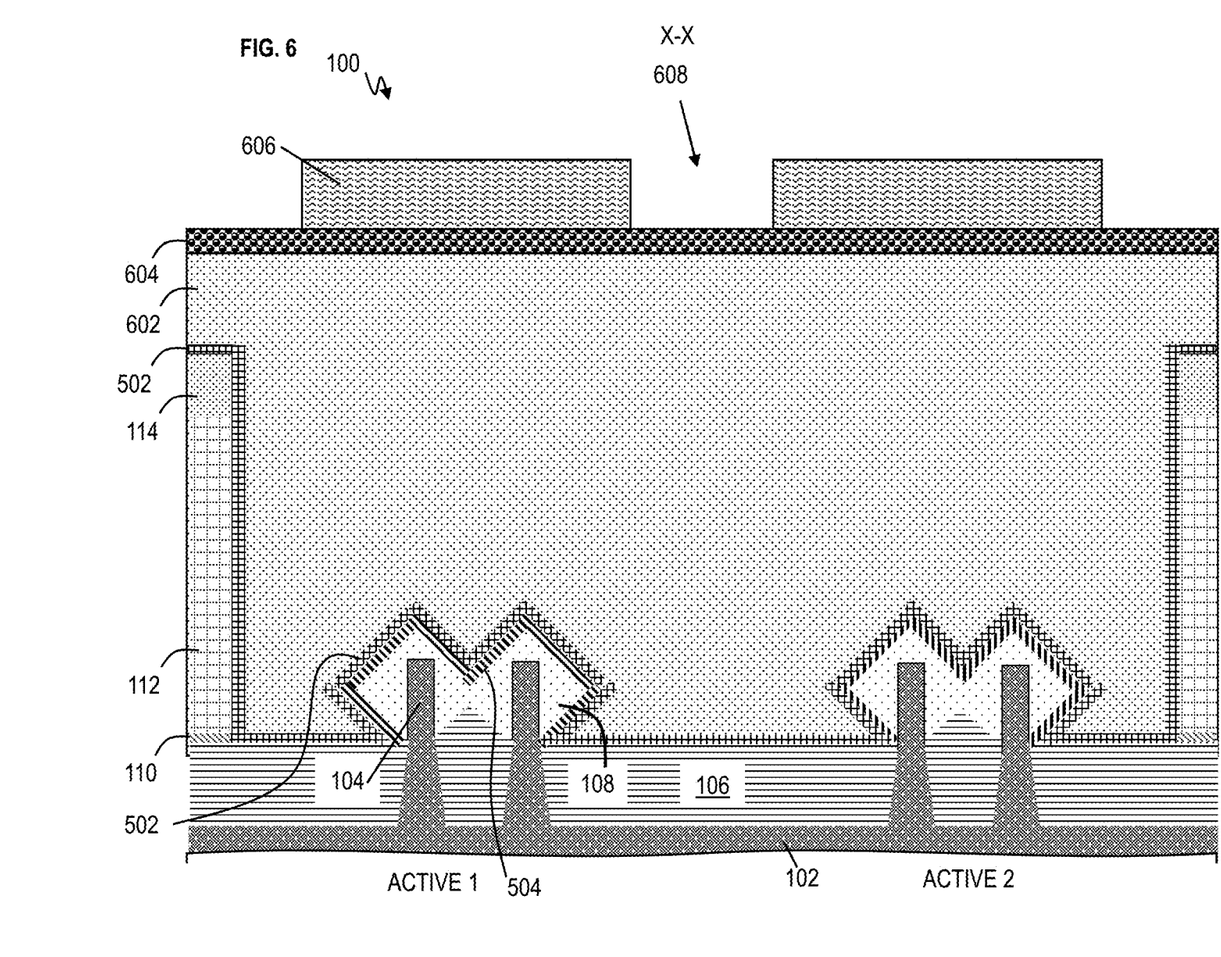
FIG. 6 depicts a cross-sectional view of the semiconductor device taken along line X-X in FIG. 1A after fabrication operations according to embodiments of the invention.

FIG. 6 depicts a cross-sectional view of the semiconductor device 100 shown in FIG. 1A taken along line X-X according to embodiments of the invention. Lithography is performed in preparation for upcoming source/drain contact patterning/cut. For example, a block layer 602 is formed on the contact liner 502 which fills in the opening 302. An ARC layer 604 is deposited on top of the block mask 602. The block layer 602 can be an organic planarization layer (OPL), an organic dielectric layer (ODL), etc. The ARC layer 604 is an oxide material, such as, for example titanium oxide (TiO). Titanium oxide is used because the TiO will be selectively removed during the metal liner etch process (i.e., etches in same chemistry as Ti/TiN). A resist layer 606 is deposited on top of the ARC layer 604. Lithography is performed to pattern the block layer region in resist layer 606. The patterned resist layer 606 protects the active regions, active regions 1 and 2, above the source/drain epitaxial regions 108 while leaving openings 608 in preparation for the source/drain contact patterning/cut in FIG. 7.

FIG. 7 depicts a cross-sectional view of the semiconductor device 100 shown in FIG. 1A taken along line X-X according to embodiments of the invention. The source/drain contact patterning/cut is performed which is inverse to the shape of the future source/drain metal contact 1002 depicted in FIG. 10. For example, the ARC layer 604 and block layer 602 are opened using an anisotropic RIE resulting in openings 702. An isotropic component can be added to the etch in order to remove any material of block layer 602 that could remain underneath the underbelly of the source/drain epitaxial regions 108.

It should be noted that source/drain contact patterning/cut maintains the wrap-around-contact silicide contact 504 previously formed. This previously formed silicide 504 is retained even when portions of the contact liner 502 are removed in subsequent fabrication processing.

Figure 8:
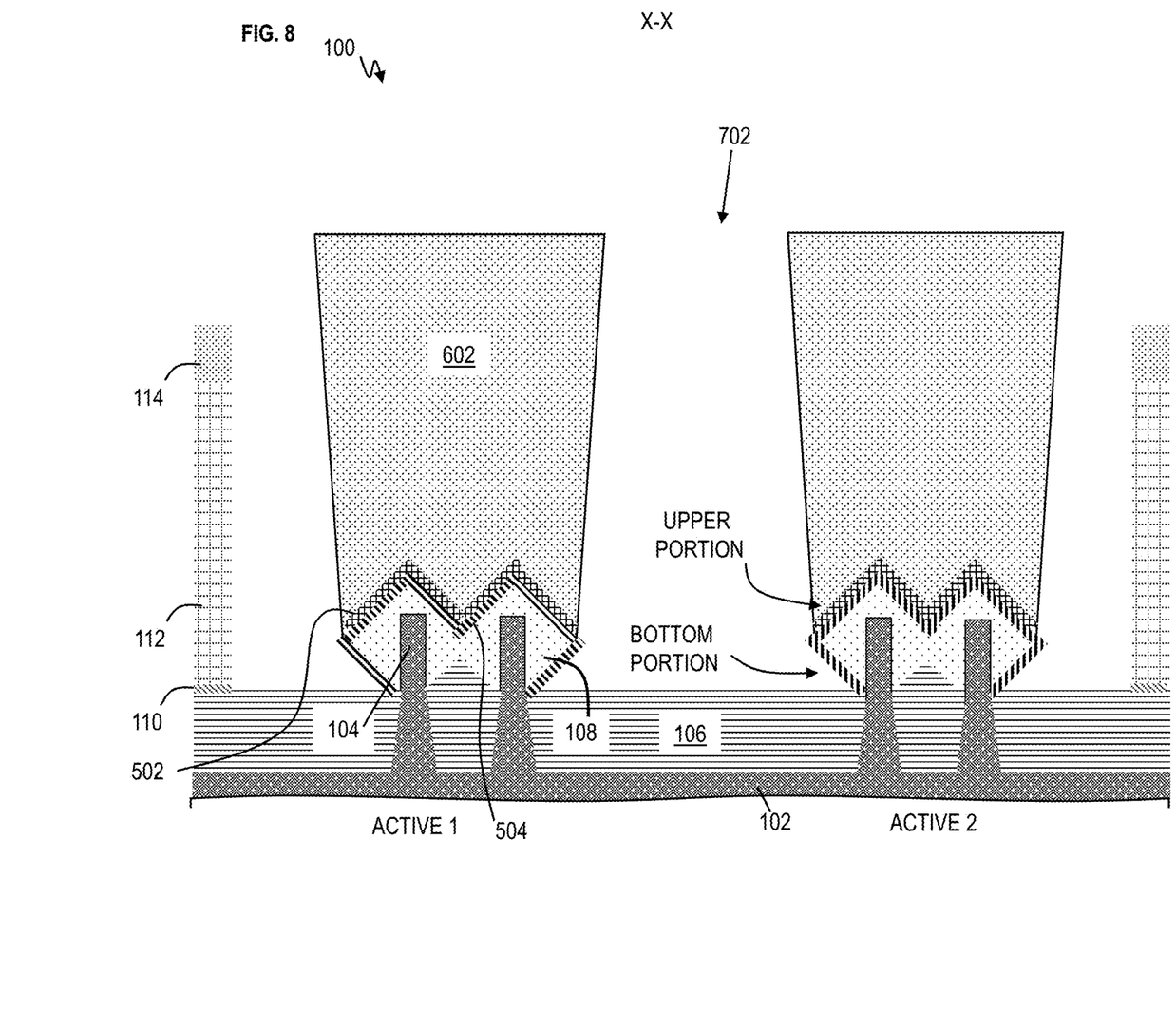
FIG. 8 depicts a cross-sectional view of the semiconductor device taken along line X-X in FIG. 1A after fabrication operations according to embodiments of the invention.

FIG. 8 depicts a cross-sectional view of the semiconductor device 100 shown in FIG. 1A taken along line X-X according to embodiments of the invention. The contact liner 502 is etched selective to the STI region 106 (e.g., $SiO_2$), the block layer 602 (e.g., OPL), and the Ti-silicide 504. The contact liner 502 can be etched using Standard Clean (SC1) as understood by one skilled in the art, which also removes the ARC layer 604. The liner etch effectively cuts the metal contact liner 502 to electrically separate active 1 from active 2. The Ti-silicide 504 remains on the epitaxial sidewalls, thereby maintain the wrap-around-contact of the silicide 504. Additionally, FIG. 8 depicts an "understrapped" cut region where the silicide 504 wraps around the source/drain epitaxial regions 108 even after etching the contact liner 502 on the source/drain epitaxial regions 108. This is beneficial for source/drain scaling (i.e., reducing the size of the source/drain regions while still maintaining the WAC) because silicide formation of silicide 504 was prior to the cutting the contact liner 502.

Figure 9:
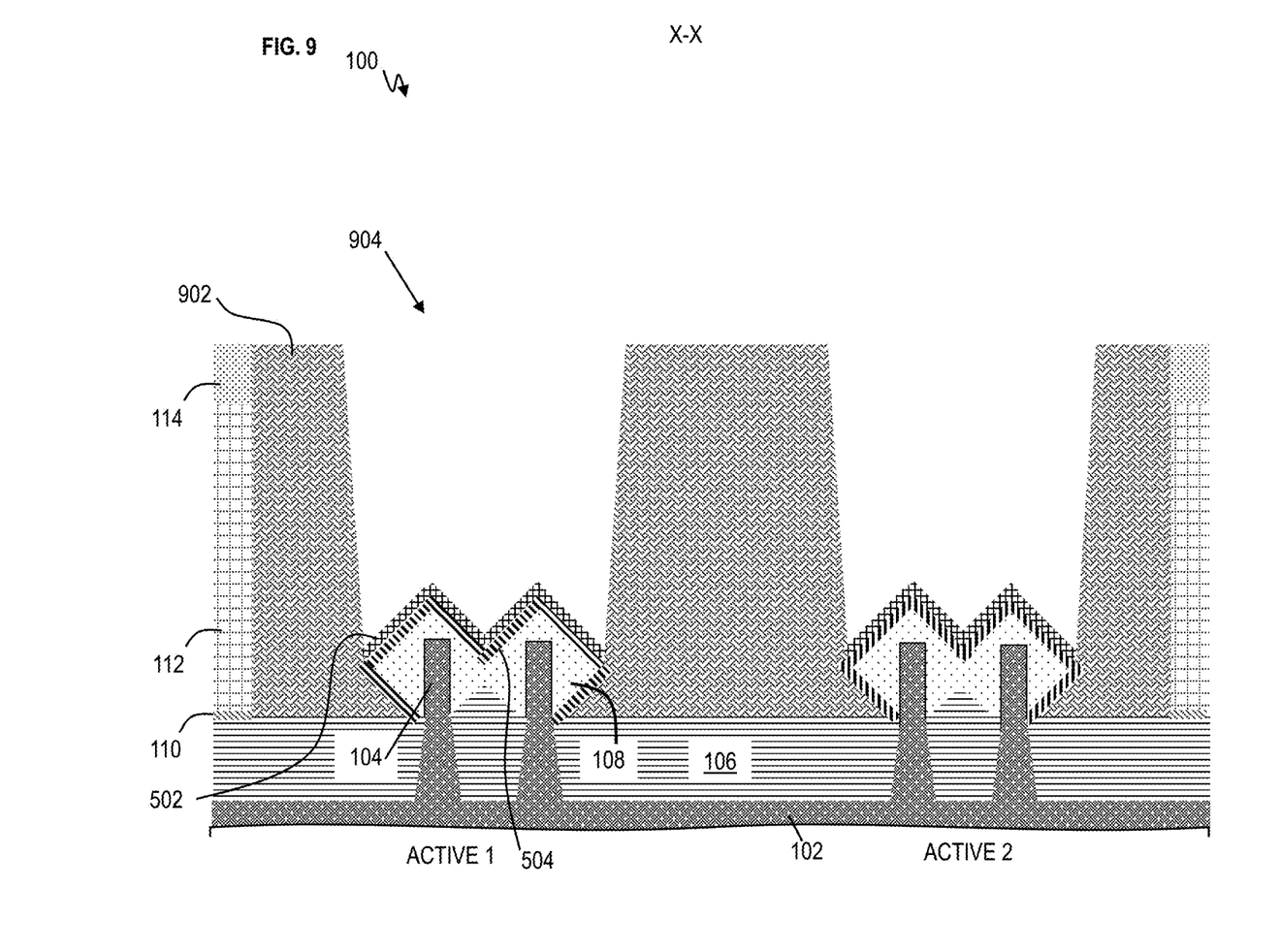
FIG. 9 depicts a cross-sectional view of the semiconductor device taken along line X-X in FIG. 1A after fabrication operations according to embodiments of the invention.

FIG. 9 depicts a cross-sectional view of the semiconductor device 100 shown in FIG. 1A taken along line X-X according to embodiments of the invention. FIG. 9 depicts the source/drain contact cut fill, etch back, and ashing. For example, the openings 702 in the source/drain contact region are filled with a fill material 902. The fill material 902 can be a strained dielectric material such as an oxide, nitride, etc. The fill material 902 can be silicon dioxide, silicon nitride, etc.

Planarization such as CMP can be performed to etch back the fill material 902 and the block layer 602 or a reactive ion etch can be performed to etch back the fill material 902. Ashing is performed to remove the block layer 602 after deposition of the fill material 902 and etch back, thereby forming source/drain contact openings 904. The openings 904 are trenches that expose the contact liner 502 covering the source and drain epitaxial regions 108 which is in preparation for metallization. The source/drain contact openings 904 are the previous locations of the block layer pillars and form the shape for the source/drain metal contacts 1002.

Figure 10:
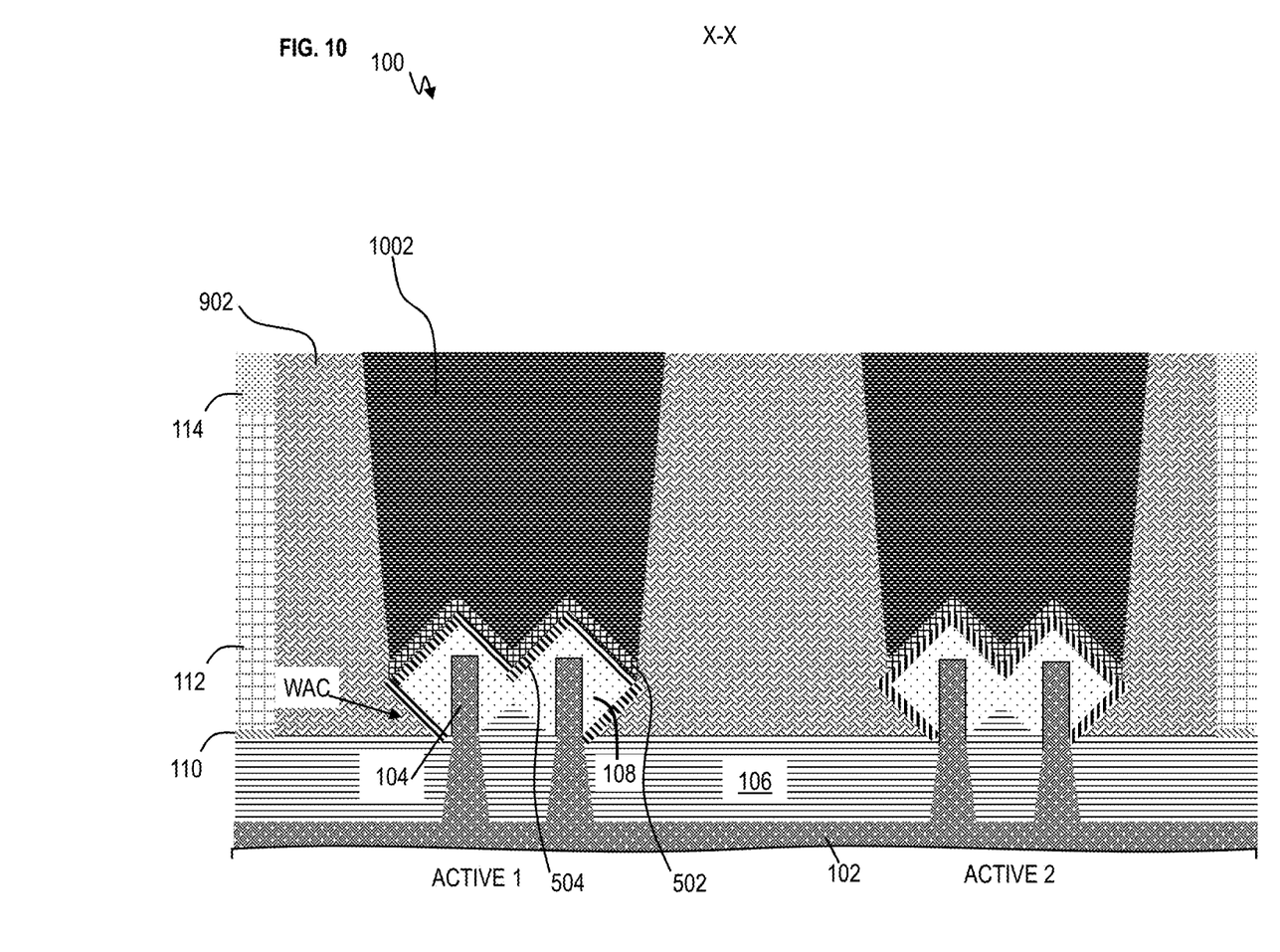
FIG. 10 depicts a cross-sectional view of the semiconductor device taken along line X-X in FIG. 1A after fabrication operations according to embodiments of the invention.

FIG. 10 depicts a cross-sectional view of the semiconductor device 100 shown in FIG. 1A taken along line X-X according to embodiments of the invention. Metallization is performed to deposit metal for source/drain contacts 1002 in the openings 904. The source/drain metal is deposited on top of the source/drain contact liner 502 so as to fill the openings 904, thereby forming source/drain contacts 1002. Examples of the source/drain metal 1002 can include tungsten (W), cobalt (Co), etc. Metal chemical mechanical planarization/polishing of the source/drain metal 1002 is performed to stop on the dielectric layer 114 and fill material 902. As can be seen, the wrap-around-contact (WAC) of the silicide 504 remains after the source/drain contact cut in FIGS. 7 and 8 which forms pillars of block 602 that coincide with source/drain metal contacts 1002.

According to embodiments of the invention, a method of forming a semiconductor device 100 is provided. The method includes forming a source and drain (S/D) contact liner 502 on one or more S/D epitaxial regions 108, and annealing to form a silicide layer 504 around the one or more S/D epitaxial regions 108, the silicide layer being formed at an interface between the S/D contact liner and the S/D regions. The method includes forming a block layer 602 into a pattern over the one or more S/D epitaxial regions 108, such that a portion of the S/D contact liner 502 is protected by the block layer 602. Also, the method includes removing unprotected portions of the S/D contact liner 502, such that the S/D contact liner 502 protected by the block layer 602 remains over the one or more S/D epitaxial regions 108, removing the block layer 602, and forming S/D contacts 1002 on the S/D contact liner 502 over the one or more S/D epitaxial regions 108.

The one or more S/D epitaxial regions 108 are formed over one or more fins 104. The S/D contact liner 502 includes a first material formed directly on the one or more S/D epitaxial regions 108 and a second material formed on the first material. Annealing to form the silicide layer 504 around the one or more S/D epitaxial regions causes the first material to form the silicide layer 504 around the one or more S/D epitaxial regions 108.

Removing the unprotected portions of the S/D contact liner 502, such that the S/D contact liner 502 protected by the block layer 602 remains over the one or more S/D epitaxial regions 108 includes etching the unprotected portions of the S/D contact liner 502 while not etching the silicide layer 504. The removal of the unprotected portions of the S/D contact liner 502 causes the silicide layer 504 to be exposed underneath the one or more S/D epitaxial regions 108.

A fill material 902 is formed subsequent to removing the unprotected portions of the S/D contact liner 502. The fill material 902 is a dielectric material. The fill material 902 is formed in openings 702 created by forming the block layer 602 into the pattern over the one or more S/D epitaxial regions 108. Removing the block layer 602 creates openings 904 for the S/D contacts 1002. The S/D contacts 1002 are formed in the opening 904.

The contact liner 502 includes a stack of titanium and titanium nitride. The block layer 602 includes an organic planarization layer (OPL). The pattern of the block layer 602 is such that the block layer 602 is formed on a top portion of the S/D epitaxial regions 108 while a bottom portion of the S/D epitaxial regions 108 is free of the block layer 602. The S/D contacts 1002 are metal.

The silicide layer 504 around the one or more S/D epitaxial regions 108 is formed of the first material (e.g., Ti) and epitaxial material of the one or more S/D epitaxial regions 108, after annealing.

According to embodiments of the invention, a source/drain cut last process of forming a semiconductor device 100 is provided. The method includes forming a source and drain (S/D) contact liner 502 on one or more S/D epitaxial regions 108, and annealing to form a silicide layer 504 around the one or more S/D epitaxial regions 108, the silicide layer being formed at an interface between the S/D contact liner and the S/D regions. The method includes forming a block layer 602 over the one or more S/D epitaxial regions 108, and cutting a pattern of trenches 702 in the block layer 602 such that a portion of the S/D contact liner 502 is protected by the block layer 602. The method includes removing unprotected portions of the S/D contact liner 502, such that the S/D contact liner 502 protected by the block layer 602 remains over the one or more S/D epitaxial regions 108, and depositing a fill material 902 in the trenches 702. Also, the method includes removing the block layer 602 to leave S/D contact openings 904 in the fill material 902, and forming S/D contacts 1002 on the S/D contact liner 502 over the one or more S/D epitaxial regions 108, such that the S/D contact 1002 are formed in the S/D contact openings 904.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a source or drain (S/D) contact liner on S/D regions, wherein an upper portion of the S/D regions comprises the S/D contact liner while a lower portion of the S/D regions is free of the S/D contact liner, wherein the upper portion is formed with a first slope having a first rise extending upward away from a shallow trench isolation (STI) region toward at least one fin, wherein the lower portion is formed with a second slope having a second rise extending upward away from both the at least one fin and the STI region, the first rise of the upper portion and the second rise of the lower portion extending upward in different directions;
   a silicide layer formed around the upper portion and the lower portion of the S/D regions, the lower portion being underneath the upper portion, wherein the silicide layer is formed between the S/D contact liner and the S/D regions, the silicide layer formed on the lower portion being in direct contact with a fill material such that there is no intervening layer between the silicide layer on the lower portion and the fill material, wherein a portion of the S/D contact liner on the upper portion is formed with the first slope having the first rise while the silicide layer on the lower portion is formed with the second slope having the second rise, the fill material being an insulating material formed directly on the STI region, wherein a part of the fill material is sandwiched in between and in direct contact with both a portion of the silicide layer on the lower portion and the STI region, the S/D regions formed of epitaxial material, wherein the fin extends through the lower portion into the upper portion of the epitaxial material such that the fin extends above any of the silicide layer formed around the lower portion of the S/D regions; and
   S/D contacts formed on the S/D contact liner over the S/D regions.

2. The semiconductor device of claim 1, wherein the S/D regions are formed over one or more fins, the S/D regions being formed with a diamond shape, wherein a part of the diamond shape comprises the upper portion formed with the first slope while another part of the diamond shape comprises the lower portion formed with the second slope, the fin extending above vertices of the diamond shape connecting the upper portion to the lower portion.

3. The semiconductor device of claim 1, wherein the S/D contact liner includes a first material formed directly on the S/D regions and a second material formed on the first material.

4. The semiconductor device of claim 3, wherein the silicide layer around the S/D regions is formed of the first material and of epitaxial material of the S/D regions, after annealing.

5. The semiconductor device of claim 1, wherein the fill material is formed on the S/D regions.

6. The semiconductor device of claim 1, wherein the fill material is formed adjacent to the S/D contact liner.

7. The semiconductor device of claim 1, wherein the fill material is formed on the silicide layer.

8. The semiconductor device of claim 7, wherein the fill material is a dielectric material.

9. The semiconductor device of claim 7, wherein the fill material comprises a strained dielectric material.

10. The semiconductor device of claim 7, wherein the fill material comprises nitride.

11. The semiconductor device of claim 7, wherein the fill material comprises oxide.

12. The semiconductor device of claim 1, wherein the silicide layer is a wrap-around-contact (WAC).

13. The semiconductor device of claim 1, wherein the silicide layer wraps around the S/D regions.

14. The semiconductor device of claim 1, wherein the silicide layer comprises titanium.

15. The semiconductor device of claim 1, wherein the S/D regions comprise p-type dopants.

16. The semiconductor device of claim 1, wherein the S/D regions comprise n-type dopants.

17. The semiconductor device of claim 1, wherein the S/D contacts comprise metal.

18. The semiconductor device of claim 1, wherein the S/D contacts comprise tungsten.

19. The semiconductor device of claim 1, wherein the S/D contacts comprise cobalt.

20. The semiconductor device of claim 1, wherein the S/D contact liner comprises a stack of titanium and titanium nitride.

* * * * *